(12) United States Patent
Nemazie

(10) Patent No.: US 8,909,855 B2
(45) Date of Patent: Dec. 9, 2014

(54) STORAGE SYSTEM EMPLOYING MRAM AND PHYSICALLY ADDRESSED SOLID STATE DISK

(71) Applicant: Avalanche Technology, Inc., Fremont, CA (US)

(72) Inventor: Siamack Nemazie, Los Altos Hills, CA (US)

(73) Assignee: Avalanche Technology, Inc., Fremont, CA (US)

(*) Notice: Subject to any disclaimer, the term of this patent is extended or adjusted under 35 U.S.C. 154(b) by 0 days.

(21) Appl. No.: 13/769,710

(22) Filed: Feb. 18, 2013

(65) Prior Publication Data
US 2014/0047165 A1 Feb. 13, 2014

Related U.S. Application Data

(63) Continuation-in-part of application No. 13/745,686, filed on Jan. 18, 2013, and a continuation-in-part of application No. 13/673,866, filed on Nov. 9, 2012, and a continuation-in-part of application No. 13/570,202, filed on Aug. 8, 2012.

(51) Int. Cl.
*G06F 13/00* (2006.01)
*G06F 13/28* (2006.01)
*G06F 12/02* (2006.01)

(52) U.S. Cl.
CPC .... *G06F 12/0246* (2013.01); *G06F 2212/7201* (2013.01); *G06F 2212/7207* (2013.01)
USPC ...... 711/103; 711/202; 711/206; 711/E12.008

(58) Field of Classification Search
CPC ................................................... G06F 12/0246
See application file for complete search history.

(56) References Cited

U.S. PATENT DOCUMENTS

2010/0191896 A1* 7/2010 Yang et al. ..................... 711/103
2014/0047159 A1* 2/2014 Ahwal et al. .................. 711/103

* cited by examiner

*Primary Examiner* — Eric S Cardwell
(74) *Attorney, Agent, or Firm* — Maryam Imam; IPxLAW Group LLP

(57) ABSTRACT

A storage system includes a Central Processing Unit (CPU) that has a physically-addressed solid state disk (SSD), addressable using physical addresses associated with user data and provided by a host. The user data is to be stored in or retrieved from the physically-addressed SSD in blocks. Further, a non-volatile memory module is coupled to the CPU and includes flash tables used to manage blocks in the physically addressed SSD. The flash tables have tables that are used to map logical to physical blocks for identifying the location of stored data in the physically addressed SSD. The flash tables are maintained in the non-volatile memory modules thereby avoiding reconstruction of the flash tables upon power interruption.

33 Claims, 4 Drawing Sheets

STORAGE SYSTEM EMPLOYING MRAM AND PHYSICALLY ADDRESSED SOLID STATE DISK

CROSS REFERENCE TO RELATED APPLICATIONS

This application is a continuation-in-part of U.S. patent application Ser. No. 13/745,686, filed on Jan. 18, 2013, by Siamack Nemazie and entitled "Physically Addressed Solid State Disk Employing MRAM", which is a continuation-in-part of U.S. patent application Ser. No. 13/673,866, filed on Nov. 9, 2012, by Siamack Nemazie and entitled "SYSTEM EMPLOYING MARAM AND PHYSICALLY ADDRESSED SOLID STATE DISK", which is a continuation-in-part of U.S. patent application Ser. No. 13/570,202, filed on Aug. 8, 2012, by Siamack Nemazie and Ngon Van Le, and entitled "SOLID STATE DISK EMPLOYING FLASH AND MAGNETIC RANDOM ACCESS MEMORY (MRAM)", which claims priority U.S. Provisional Application No. 61/538,697, filed on Sep. 23, 2011, entitled "Solid State Disk Employing Flash and MRAM", by Siamack Nemazie, incorporated herein by reference as though set forth in full.

BACKGROUND OF THE INVENTION

1. Field of the Invention

This invention relates generally to storage systems, and particularly to storage systems utilizing physically-addressed solid state disk (SSD).

2. Background

Solid State Drives (SSDs) using flash memories have become a viable alternative to Hard Disc Drives (HDDs) in many applications. Such applications include storage for notebook, tablets, servers and network-attached storage appliances. In notebook and tablet applications, storage capacity is not too high, and power and or weight and form factor are key metric. In server applications, power and performance (sustained read/write, random read/write) are key metrics. In network-attached storage appliances, capacity, power, and performance are key metrics with large capacity being achieved by employing a number of SSDs in the appliance. SSD may be directly attached to the system via a bus such as SATA, SAS or PCIe.

Flash memory is a block-based non-volatile memory with each block organized into and made of various pages. After a block is programmed into the flash memory, it must be erased prior to being programmed again. Most flash memory require sequential programming of pages within a block. Another limitation of flash memory is that blocks can only be erased for a limited number of times, thus, frequent erase operations reduce the life time of the flash memory. A Flash memory does not allow in-place updates. That is, it cannot overwrite existing data with new data. The new data are written to erased areas (out-of-place updates), and the old data are invalidated for reclamation in the future. This out-of-place update causes the coexistence of invalid (i.e. outdated) and valid data in the same block.

Garbage Collection is the process to reclaim the space occupied by the invalid data, by moving valid data to a new block and erasing the old block. But garbage collection results in significant performance overhead as well as unpredictable operational latency. As mentioned, flash memory blocks can be erased for a limited number of times. Wear leveling is the process to improve flash memory lifetime by evenly distributing erases over the entire flash memory (within a band).

The management of blocks within flash-based memory systems, including SSDs, is referred to as flash block management and includes: Logical to Physical Mapping; Defect management for managing defective blocks (blocks that were identified to be defective at manufacturing and grown defective blocks thereafter); Wear leveling to keep program/erase cycle of blocks within a band; Keeping track of free available blocks; and Garbage collection for collecting valid pages from a plurality of blocks (with a mix of valid and invalid page) into one block and in the process creating free blocks. The flash block management requires maintaining various tables referred to as flash block management tables (or "flash tables"). These tables are generally proportional to the capacity of SSD.

Generally, the flash block management tables can be constructed from metadata maintained on flash pages. Metadata is non-user information written on a page. Such reconstruction is time consuming and generally performed very infrequently upon recovery during power-up from a failure (such as power fail). In one prior art technique, the flash block management tables are maintained in a volatile memory, and as mentioned, the flash block management tables is constructed from metadata maintained in flash pages during power-up. In another prior art technique, the flash block management tables are maintained in a battery-backed volatile memory, utilized to maintain the contents of volatile memory for an extended period of time until power is back and tables can be saved in flash memory. In yet another prior art technique, the flash block management tables are maintained in a volatile RAM, the flash block management tables are periodically and/or based on some events (such as a Sleep Command) saved (copied) back to flash, and to avoid the time consuming reconstruction upon power-up from a power failure additionally a power back-up means provides enough power to save the flash block management tables in the flash in the event of a power failure. Such power back-up may comprise of a battery, a rechargeable battery, or a dynamically charged super capacitor.

The flash block management is generally performed in the SSD and the tables reside in the SSD. Alternatively, the flash block management may be performed in the system by a software or hardware, commands additionally include commands for flash management commands and the commands use physical addresses rather than logical addresses. An SSD with commands using physical addresses is referred to as Physically-Addressed SSD. The flash block management tables are maintained in the (volatile) system memory.

A storage system (also referred to as "storage array", or "storage appliance") is a special purpose computer system attached to a network, dedicated to data storage and management. The storage system may be connected to Internet Protocol (IP) Network running Network File System (NFS) protocol or Common Internet File System (CIFS) protocol or Internet Small Computer System (iSCSI) protocol or to a Storage Area Network (SAN) such as Fiber Channel (FC) or Serial Attached SCSI (SAS) for block storage.

In a storage system employing physically-addressed SSD which maintains the flash block management tables on the system memory that has no power back-up means for the system and no power back-up means for the system memory, the flash block management tables that reside in the system memory are lost and if copies are maintained in the flash onboard the SSD, the copies may not be updated and/or may be corrupted if power failure occurs during the time a table is being saved (or updated) in the flash memory.

Hence, during a subsequent power up, during initialization, the tables have to be inspected for corruption due to power fail and, if necessary, recovered. The recovery requires reconstruction of the tables to be completed by reading metadata from flash pages and results in further increase in delay for system to complete initialization. The process of complete reconstruction of all tables is time consuming, as it requires metadata on all pages of SSD to be read and processed to reconstruct the tables. Metadata is non-user information written on a page. This flash block management table recovery, during power-up, further delays the system initialization, the time to initialize the system is a key metric in many applications.

Yet another similar problem of data corruption and power fail recovery arises in SSDs and also HDDs when write data for write commands (or queued write commands when command queuing is supported) is cached in a volatile system memory and command completion issued prior to writing to media (flash or Hard Disc Drive). It is well known in the art that caching write data for write commands (or queued write commands when command queuing is supported) and issuing command completion prior to writing to media significantly improves performance.

Additionally, file systems and storage systems employ journaling or logging for error recovery, the journal or log associated with a command or commands is saved in a persistent storage. In the event of a power fail or system crash or failure the journal or log is played back to restore the system to a known state.

As mentioned before, in some prior art techniques, a battery-backed volatile memory is utilized to maintain the contents of volatile memory for an extended period of time until power is back and tables can be saved in flash memory.

Battery backup solutions for saving system management data or cached user data during unplanned shutdowns are long-established but have certain disadvantage including upfront costs, replacement costs, service calls, disposal costs, system space limitations, reliability and "green" content requirements.

What is needed is a system employing physically-addressed SSD to reliably and efficiently preserve flash block management tables in the event of a power interruption.

SUMMARY OF THE INVENTION

Briefly, in accordance with one embodiment of the invention, a storage system includes a Central Processing Unit (CPU), a system memory, a network interface controller for connection to a network and one or more physically addressed SSD (paSSD), coupled to the CPU through a system bus such as Peripheral Component Interconnect Express (PCIe) bus and addressable using physical addresses for storing data provided via the network. The data is to be stored in or retrieved from the physically-addressed SSD in blocks.

Further, a non-volatile memory module is coupled to the CPU and used for storing flash block management tables (also referred to herein as "flash tables"), caching data, and maintaining a journal (the terms "journal" and "log" are used interchangeably herein), in addition to flash tables used to manage blocks in the physically-addressed SSD. The flash tables have tables that are used to map logical to physical blocks for identifying the location of stored data in the physically-addressed SSD. The flash tables are maintained in the non-volatile memory modules thereby avoiding reconstruction of the flash tables upon power interruption.

These and other objects and advantages of the invention will no doubt become apparent to those skilled in the art after having read the following detailed description of the various embodiments illustrated in the several figures of the drawing.

IN THE DRAWINGS

FIG. 1 shows a storage system 700, in accordance with an embodiment of the invention.

FIG. 1a shows exemplary contents of the system memory 762, the NV module 762, and the flash subsystem 110, in accordance with an embodiment of the invention.

FIG. 1b shows exemplary contents of the system memory 746, the NV module 762, and the flash subsystem 110, in accordance with another embodiment of the invention.

DETAILED DESCRIPTION OF THE VARIOUS EMBODIMENTS

Figure 1:
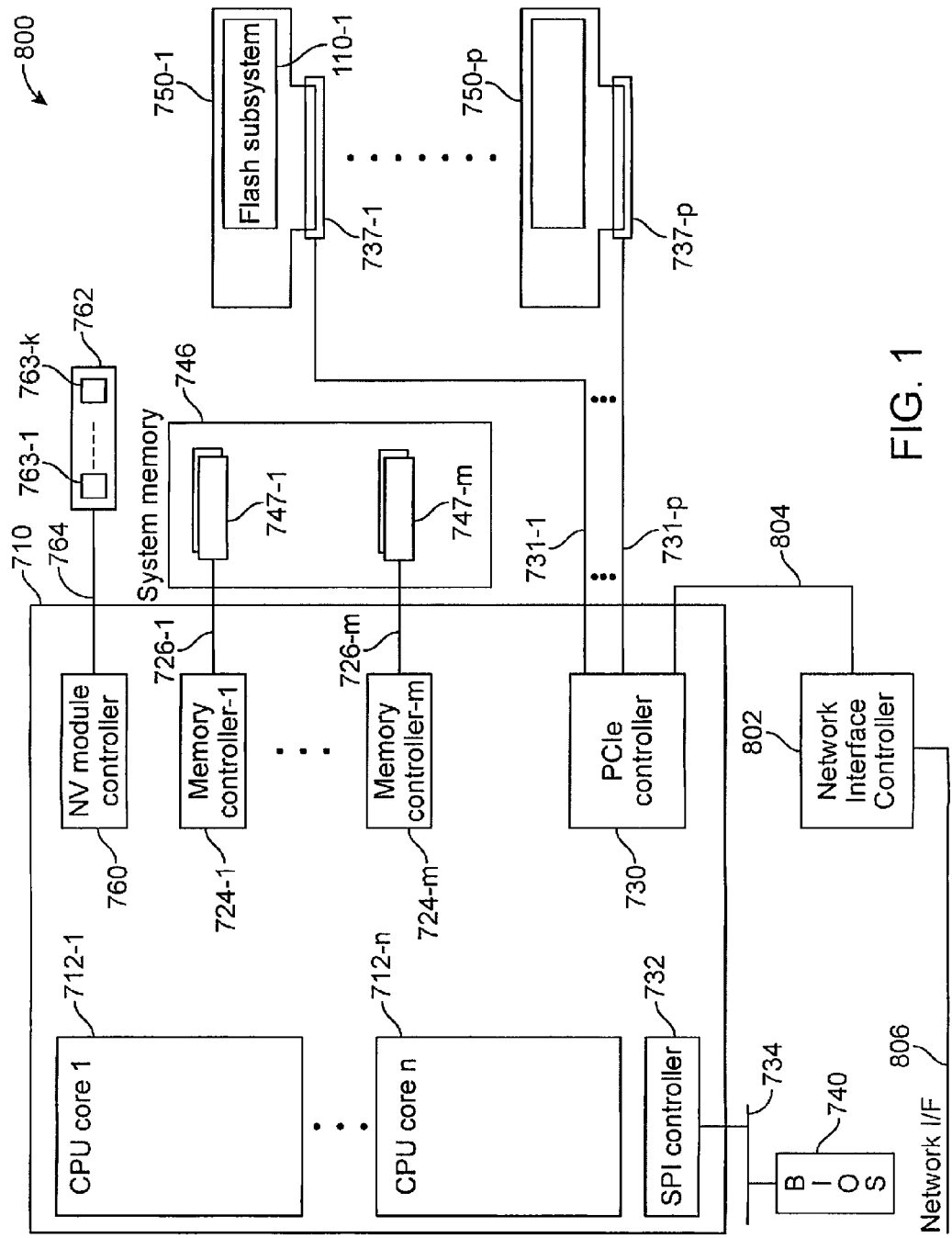

In an embodiment of the invention, a storage system includes a Central Processing Unit (CPU) a system memory, a network interface controller for connection to a network and one or more physically addressed SSD (paSSD), coupled to the CPU through a system bus such as Peripheral Component Interconnect Express (PCIe) bus and addressable using physical addresses for storing data provided via the network. The data is to be stored in or retrieved from the physically-addressed SSD in blocks.

Further, a non-volatile memory module is coupled to the CPU and used for storing flash block management tables (also referred to herein as "flash tables"), caching data, and maintaining a journal. The flash tables have tables that are used to map logical to physical blocks for identifying the location of stored data in the physically addressed SSD. The flash tables are maintained in the non-volatile memory modules thereby avoiding reconstruction of the flash tables upon power interruption.

In one embodiment, all flash block management tables are in one or more non-volatile memory module comprised of MRAM coupled to processor though memory channels.

In an alternate embodiment, tables are maintained in system memory and are near periodically saved in flash onboard the physically-addressed SSD and the parts of the tables that are updated since last saved are additionally maintained in a non-volatile memory module comprised of MRAM that is coupled to the processor though memory channels, the current version of the block management table that is in flash along with the updates that are saved in MRAM being used to reconstruct the flash block management tables in system memory upon system power-up.

In yet another alternate embodiment, in order to reduce the size of updates in MRAM and frequency of flash table copy back to flash, one or more of the updates (along with revision numbers), are also copied to flash. The current version of the block management table that is saved in flash, along with past updates, that are saved in flash and recent updates that are saved in MRAM are used to reconstruct the flash block management tables in system memory upon system power-up.

In yet another embodiment, the contents of MRAM are coupled to the processor through a system bus such as Serial Peripheral Interface (SPI) bus or PCIe with analogous methods of the invention used to reconstruct the flash block management tables in system memory upon system power-up, such as by either using the current version of the block management table in flash along with recent updates that are saved in MRAM or using the current version of the block management table in flash along with the past updates that are saved in flash. The recent updates that are saved in the MRAM are used to reconstruct the flash block management tables in the system memory upon power-up.

In yet another embodiment, the physically-addressable SSD includes a flash subsystem and a non-volatile memory comprised of MRAM. In some embodiment of the invention, flash block management tables are maintained in the system memory and are nearly periodically saved in the flash subsystem onboard the paSSD and the parts of the tables that are updated since the last save are additionally maintained in the MRAM that is onboard the paSSD via methods that physically address the MRAM rather than the flash.

In all the above embodiments, cached data and/or journals can optionally be stored in the MRAM.

Referring now to FIG. 1, a storage system 800 is shown, in accordance with an embodiment of the invention. The system 800 is shown to include a Central Processor Unit (CPU) 710 (also known herein as "processor 710"), a system memory 746, a non-volatile (NV) memory module 762, a basic input and output system (BIOS) 740, and a bank of physically-addressed solid state disks (SSD) 750-1 to 750-$p$, '$p$' being an integer value, in accordance with an embodiment of the invention. A "bank", as used herein, refers to one or more.

The CPU 710 of system 800 is shown to include a bank of CPU cores 712-1 through 712-$n$, '$n$' being an integer value, a bank of memory controllers 724-1 through 724-$m$, '$m$' being an integer value, shown coupled to a bank of memory channels 726-1 through 726-$m$, a PCIe controller 730. The CPU 710 is further shown to include an NV module controller 760, and a SPI controller 732. The network interface controller 802 is shown coupled through a PCIe bus 804 to PCIe controller 730 and CPU 710.

The bank of paSSDs 750-1 to 750-$p$ is shown coupled to the CPU 710 through a respective one of a bank of sockets 737-1 to 737-$p$. The NV module 762 is shown coupled to the CPU 710 through a NV memory channel 764. The system memory 746 is shown coupled to include a bank of volatile RAM (DRAM) modules 747-1 through 747-$m$ that are coupled to the memory controllers 724-1 through 724-$m$ through a respective one of a bank of memory channels 726-1 to 726-$m$.

The PCIe controller 730 is shown coupled to a bank of PCIe busses 731-1 through 731-$p$ that couple the CPU 710 to a bank of paSSD 750-1 through 750-$p$, Further shown in FIG. 1 is the CPU 710 including a (SPI) controller 732, which is shown coupled to the BIOS 740, the BIOS 740 shown residing externally to the CPU 710.

The NV module 762, which is also shown to reside externally to the CU 710, includes a bank of MRAMs 763-1 through 763-$k$ that are shown coupled to the NV module controller 760 via the NV memory channel 764. In an embodiment of the invention, the NV memory channel 764 is analogous to the memory channels 726/728 and the NV module controller 760 is analogous to the memory controller 724.

The NV memory channel 764 couples the NV module 762 to the NV module controller 760 of the CPU 710. In an embodiment of the invention, the NV memory channel 764 is a DRAM memory channel.

In some embodiments, in addition to using the NV memory module 762 as flash tables, the NV memory module 762 is used by the system 800 as non-volatile cache for storing in-coming data (data that is input to the system 800) and or storing a journal.

Although a memory module is employed in the embodiments wherein one or memory devices are on a removable unit, other embodiments of employing memory devices in the system such as non-removable memory devices all within the scope of invention.

Network Interface Controller 802 is shown coupled to the processor 710 via the PCIe bus 804 and coupled to network interface 806 for connection to a network via network interface 806. The network interface controller 802 implements the circuitry required to communicate with a specific physical layer and the data link layer for receiving and transmitting information packets including command/status and data. The network interface controller 802 implements the circuitry required for upper layer protocols (the layer above the data link layer, such as transport layer, application layer, and the like).

In some embodiments, the network interface 806 is a Gigabit or ten Gigabit Ethernet running Internet Small Computer System Interface (iSCSI) and in other embodiments, it is a Serial Attached SCSI (SAS) or Fiber Channel (FC), which are generally used with block storage protocols. In yet other embodiments, the network interface 806 is Gigabit or ten Gigabit Ethernet running network file storage (NFS) protocol. All of the foregoing interfaces are known in the art. In particular, the Ethernet capabilities are either integrated into the CPU or implemented via a low-cost dedicated NIC 802, connected through the PCIe bus 804 as shown in FIG. 1.

In some embodiments, the flash subsystem 110 is made of flash NAND memory. In some embodiment, the flash subsystem 110 is made of flash NOR memory.

The CPU 710 of storage system 800 is shown to include one or more physically-addressed solid state disk 750-1 through 750-$p$, wherein the blocks are addressed with a physical rather than a logical address. The paSSD 750 includes flash subsystem 110. For example, the physically-addressed solid state disk 750-1 is shown to include the flash subsystem 110-1. In the storage system 800 of FIG. 1, flash block management is performed by a software driver (also known herein as the "driver") 702 that is loaded during initialization of the system 800, after power-up. In addition to user commands, commands sent to the paSSD 750 include commands for flash management (including garbage collection, wear leveling, saving flash tables) and these commands use physical address rather than logical address.

In one embodiment of the invention, as shown in FIG. 1$a$, the flash table 201 is saved in the non-volatile memory module 762 that is made of the MRAMs 763-1 thru 763-$k$ of the embodiment of FIG. 1.

FIG. 1$a$ shows exemplary contents of the system memory 746, the NV module 762, and the flash subsystem 110, in accordance with an embodiment of the invention. The system memory 746 is shown to include a driver 702, the NV module 762 is shown to include the flash tables 201, journal 251, cache 261, and the flash subsystem 110 is shown to include the user data 366. The driver 702, shown saved in system memory 746, in FIG. 1$a$, performs flash block management. The flash tables 201 are tables generally used for management of the flash memory blocks within the paSSD 750 of FIG. 1 and the user data 366 is generally information received by the paSSD 750 from the CPU 710 to be saved. The flash tables 201 include tables used for managing flash memory blocks. The driver 702 generally manages the flash memory blocks. As shown in FIG. 1$a$, the flash table 201 is maintained in the module 762.

As noted above, the flash subsystem 110 is addressed using physical and not logical addresses, provided by the CPU 710.

In an alternate embodiment, the flash tables 201 are maintained in the system memory 762 and are substantially periodically saved in the flash subsystem 110 of the paSSD 750, and the parts of the tables 201 that are updated (modified) since the previous save are additionally saved in the non-volatile memory module 762.

Figure 1B:
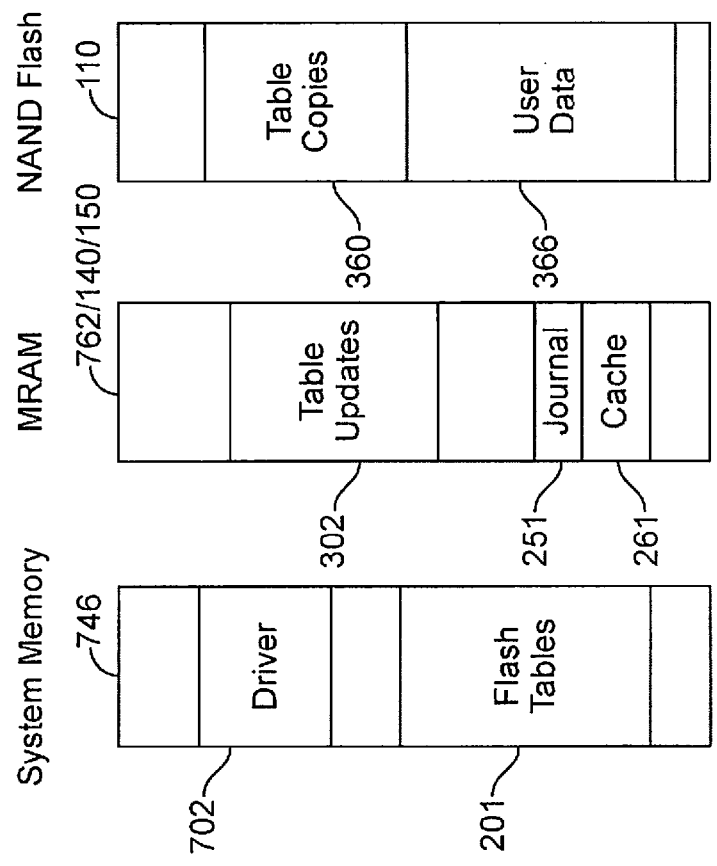
Figure 1A:
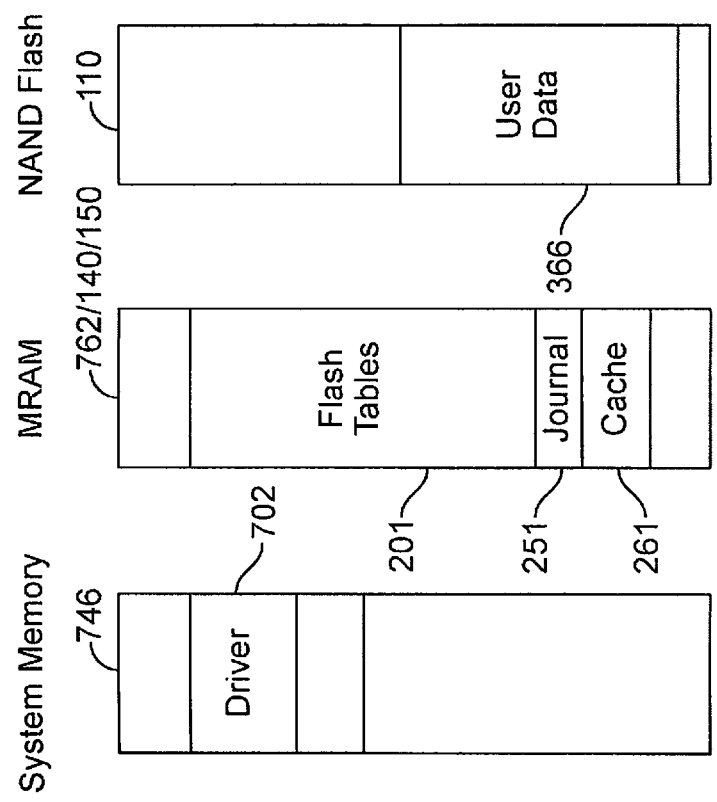

FIG. 1b shows exemplary contents of the system memory 746, the NV module 762, and the flash subsystem 110, in accordance with another embodiment of the invention. In FIG. 1b, the system memory 746 is shown to include the driver 702 in addition to the flash tables 201. The NV module 762 is shown to include the table updates 302, journal 251, cache 261 and the flash subsystem 110 is shown to include table copies 360 and the user data 366. As previously noted, the flash tables 201 are tables that are generally used for management of blocks within the SSD 750. The table updates 302 are generally updates to the flash tables 201 since the last copy of the flash tables 201 was initiated until a subsequent copy is initiated. The table copies 360 are snapshots of the flash tables 201 that are saved in the flash subsystem 110. This is further explained in U.S. patent application Ser. No. 13/673,866, filed on Nov. 9, 2012, by Siamack Nemazie, and entitled "System Employing MRAM and Physically Addressed Solid State Disk", the contents of which are incorporated herein by reference as though set forth in full. The user data 366 is information provided by the host (CPU 710 of FIG. 1).

In some embodiments, the NV module 762 includes spin torque transfer MRAM (STTMRAM).

In some embodiments, the NV module 762 is coupled to the CPU 710 via a system bus. An exemplary system bus is Serial Protocol Interconnect (SPI) or PCIe.

Accordingly, storage system 800 and the flash tables 201 are used to manage blocks in the paSSD 750. The flash tables 201 include tables that are used to map logical blocks to physical blocks for identifying the location of stored data in the paSSD 750 and the flash tables are maintained in the NV module 762, which advantageously avoids reconstruction of the flash tables upon power interruption of the storage system 800.

Additionally, a cache or in particular a write back cache is maintained in the non-volatile memory module 762. The write cache contents are written to the paSSD 750 upon triggers, such trigger including, among others, the cached data in the cache 261 to reach a certain limit. In one embodiment, the contents of the cache 261 are written to the psSSDs in units of pages that are each aligned to a page boundary. In one embodiment, partial pages are maintained in the non-volatile memory module 762 and coalesced with other writes to write a full page to SSDs. In another embodiment, the partial page in the non-volatile memory module 762 is merged with the unmodified portion of the page in SSD, so that the page in the cache reflects the state of the page.

Journaling is generally a known practice for logging the changes that will be made in a journal (usually a circular log in a dedicated area) before committing them to the main storage. In the event of a system crash or power failure, such file systems are quicker to bring back online and less likely to become corrupted. A "journal" maybe optionally maintained in the non-volatile memory module 762. In the exemplary embodiments the NV module 762 is shown to include a journal 251

Figure 2:
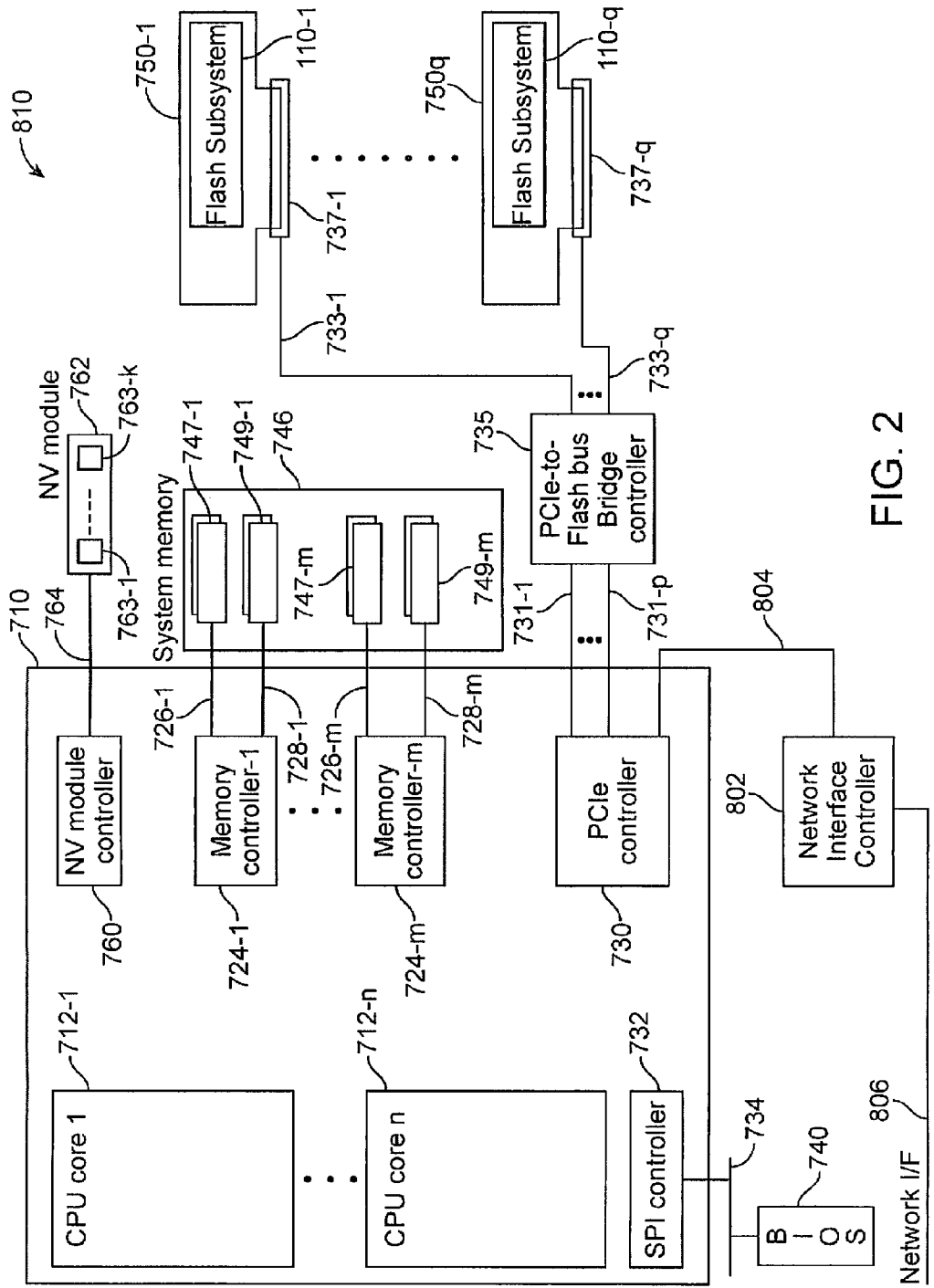
FIG. 2 shows a storage system 810, in accordance with another embodiment of the invention.

FIG. 2 shows a storage system 810, in accordance with another embodiment of the invention. The system 810 is analogous to the system 800 except that the system 810 additionally includes a PCIe-to-Flash bus Bridge controller 735 to couple a plurality of PCIe buses 731-1 through 731- to a bank of flash buses 733-I (where i is from 1 through q) each coupled to a paSSD 750-$i$ through connector 737-I, 'i' being an integer value. An example of a flash bus is Open NAND Flash Interface (ONFI).

Except for a different interface to the paSSDs, the operation of system 810 is analogous to system 800.

Figure 3:
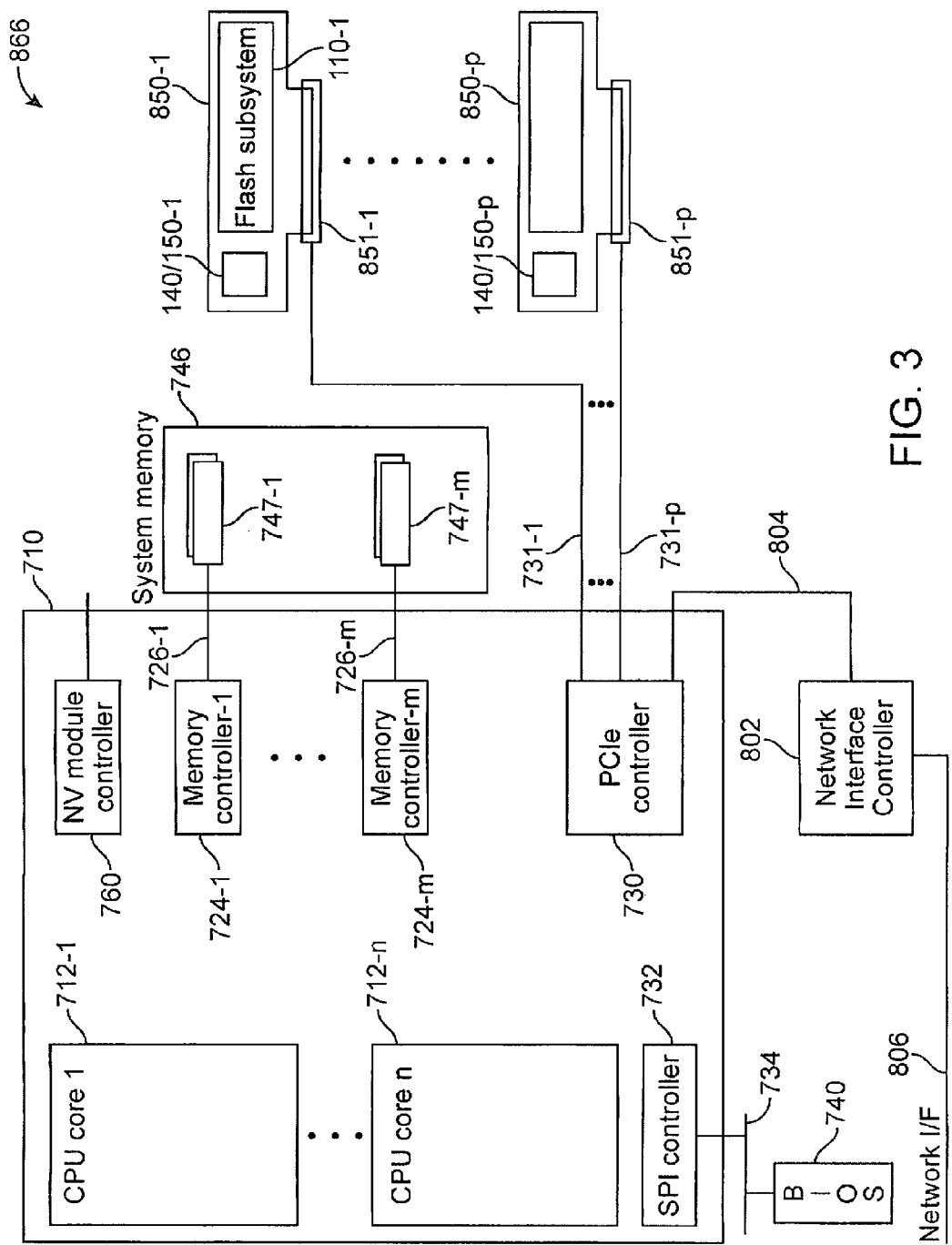
FIG. 3 shows a storage system 866, in accordance with another embodiment of the invention.

FIG. 3 shows a storage system 865, in accordance with another embodiment of the invention. The system 865 is analogous to the system 800 except that the system 865 does not employ an NV module, and the paSSDs 850-1 through 850-$p$ employ MRAM specifically MRAMs 140/150-1 through 140/150-$p$ respectively. The operation of paSSDs 850-1 through 850-$p$ and its operation in a system is further explained in U.S. patent application Ser. No. 13/745,686, filed on Jan. 18, 2013, by Siamack Nemazie, and entitled "Physically Addressed Solid State Disk Employing MRAM", the contents of which are incorporated herein by reference as though set forth in full.

Except for a removing NV module 762 and employing a paSSD employing MRAM the structure of system 865 is analogous to system 800.

Although the invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A storage system comprising:
a Central Processing Unit (CPU) responsive to one or more commands including user data and logical addresses identifying the user data, the CPU including a PCIe controller;
a plurality of physically-addressed solid state disk (SSDs) configured to store the user data and individually coupled, through a PCIe bus, to the CPU and individually responsive to one or more queued commands, each of the queued commands including a physical address and using the physical addresses to identify the location of the user data to be stored in or retrieved from at least one of the plurality of physically-addressed SSDs in blocks, each of the plurality of physically-addressed SSDs being located externally to the CPU, the PCIe controller coupled to the plurality of physically-addressed SSDs;
a non-volatile memory module coupled to the CPU, the non-volatile memory module including flash tables used to manage blocks in the physically-addressed SSD, the flash tables including tables used to map logical to physical addresses for identifying the location of stored user data in physically-addressed SSD; and
a network interface controller coupled through a second PCIe bus to the CPU, the network interface controller further coupled to the PCIe controller,
wherein the flash tables are maintained in the non-volatile memory modules thereby avoiding reconstruction of the flash tables upon power interruption.

2. The storage system, as recited in claim 1, wherein the physically-addressed solid state disk (SSD) includes a flash subsystem, further wherein the flash subsystem is made of flash NAND memory.

3. The storage system, as recited in claim 1, wherein the plurality of physically-addressed solid state disk (SSD) is coupled through a flash bus to the CPU.

4. The storage system, as recited in claim 1, wherein the non-volatile memory module includes MRAM.

5. The storage system, as recited in claim 1, wherein the non-volatile memory module includes STTMRAM.

6. The storage system, as recited in claim 1, wherein the non-volatile memory module is coupled to the CPU through a NV memory channel.

7. The storage system, as recited in claim 6, wherein the NV memory channel is a DRAM memory channel.

8. The storage system, as recited in claim 1, wherein the NV memory module is coupled to the CPU via a system bus.

9. The storage system, as recited in claim 1, further including a system memory coupled to the CPU and configured to store software driver for managing the flash tables.

10. The storage system, as recited in claim 1, wherein the non-volatile memory module is configured to store a cache for caching the user data.

11. The storage system, as recited in claim 1, wherein the non-volatile memory module is configured to store a journal for logging changes before committing the changes.

12. The storage system, as recited in claim 1, wherein the PCIe controller is directly connected to the plurality of physically-addressed SSDs.

13. The storage system, as recited in claim 1, wherein the non-volatile memory module includes flash memory into which the flash tables are stored, further wherein, the plurality of physically-addressable SSDs are written to in units of blocks and the flash memory is written to in units of pages.

14. A storage system comprising:
a Central Processing Unit (CPU) responsive to one or more commands including user data through a network interface controller (NIC), the commands further including logical addresses identifying user data;
a plurality of physically-addressed solid state disk (SSDs) configured to store the user data and individually coupled, through a PCIe bus, to the CPU and individually responsive to one or more queued commands, each of the queued commands including a physical address and using the physical addresses to identify the location of the user data to be stored in or retrieved from at least one of the plurality of physically-addressed SSDs in blocks, each of the plurality of physically-addressed SSDs being located externally to the CPU;
a system memory coupled to the CPU, the system memory including flash tables used to manage blocks in the physically-addressed SSD, the flash tables including tables used to map logical to physical blocks for identifying the location of stored data in the physically-addressed SSD; and
a network interface controller coupled through a second PCIe bus to the CPU,
wherein each of the physically-addressable SSDs includes a flash subsystem that includes flash memory configured to save snapshots of the flash tables including a previous version of the flash tables and a current version of the flash tables under the direction of the CPU, a non-volatile memory module including a magnetic random access memory (MRAM) configured to store changes to the flash tables,
wherein the current version of the snapshot of the flash tables is used to reconstruct the flash tables upon power interruption,
further wherein the flash tables are substantially periodically saved in the plurality of physically-addressed SSDs, and parts of the flash tables that are updated since a previous save are saved in the non-volatile memory module.

15. The storage system, as recited in claim 14, wherein the flash subsystem is made of flash NAND memory.

16. The storage system, as recited in claim 14, wherein the plurality of physically-addressed SSD are coupled through a flash bus to the CPU.

17. The storage system, as recited in claim 14, wherein the non-volatile memory module includes MRAM.

18. The storage system, as recited in claim 14, wherein the non-volatile memory module includes STTMRAM.

19. The storage system, as recited in claim 14, wherein the non-volatile memory module is coupled to the CPU through a memory channel.

20. The storage system, as recited in claim 19, wherein the non-volatile memory module is a DRAM memory channel.

21. The storage system, as recited in claim 14, wherein the non-volatile memory module is coupled to the CPU via a system bus.

22. The storage system, as recited in claim 14, wherein system memory is configured to store a software driver for managing the flash tables.

23. The storage system, as recited in claim 14, wherein the non-volatile memory module is configured to store a cache for caching the user data.

24. The storage system, as recited in claim 14, wherein the non-volatile memory module is configured to store a journal for logging changes before committing the changes.

25. The storage system, as recited in claim 14, wherein the PCIe controller is directly connected to the plurality of physically-addressed SSDs.

26. A computer system comprising:
a Central Processing Unit (CPU) responsive to one or more commands including user data through a network interface controller (NIC), the commands further including logical addresses identifying user data, the CPU including a PCIe controller;
a plurality of physically-addressed solid state disk (SSDs) configured to store the user data and individually coupled, through a PCIe bus, to the CPU and individually responsive to one or more queued commands, each of the queued commands including a physical address and using the physical addresses to identify the location of the user data the user data to be stored in or retrieved from at least one of the plurality of physically-addressed SSDs in blocks, each of the plurality of physically-addressed SSDs being located externally to the CPU, the PCIe controller coupled to the plurality of physically-addressed SSDs;
a non-volatile memory module coupled to the CPU, the non-volatile memory module including flash tables used to manage blocks in the physically-addressed SSD, the flash tables including tables used to map logical to physical addresses for identifying the location of stored user data in the physically-addressed SSD,
a network interface controller coupled through a second PCIe bus to the CPU, the network interface controller further coupled to the PCIe controller; and
wherein the flash tables are maintained in the non-volatile memory modules thereby avoiding reconstruction of the flash tables upon power interruption.

27. The computer system, as recited in claim 26, wherein the non-volatile memory module is configured to store a cache for caching the user data.

28. The computer system, as recited in claim 26, wherein the non-volatile memory module is configured to store a journal for logging changes before committing the changes.

29. The computer system, as recited in claim 26, wherein the PCIe controller is directly connected to the plurality of physically-addressed SSDs.

30. A computer system comprising:

a Central Processing Unit (CPU) responsive to one or more commands including user data through a network interface controller (NIC), the commands further including logical addresses identifying user data;

a plurality of physically-addressed solid state disk (SSDs) configured to store the user data and individually coupled, through a PCIe bus, to the CPU and individually responsive to one or more queued commands, each of the queued commands including a physical address and using the physical addresses to identify the location of the user data the user data to be stored in or retrieved from at least one of the plurality of physically-addressed SSDs in blocks, each of the plurality of physically-addressed SSDs being located externally to the CPU;

a system memory coupled to the CPU, the system memory including flash tables used to manage blocks in the physically-addressed SSD, the flash tables including tables used to map logical to physical blocks for identifying the location of stored data in the physically-addressed SSD; and a network interface controller coupled through a second PCIe bus to the CPU, wherein each of the physically-addressable SSDs includes a flash subsystem that includes flash memory configured to save snapshots of the flash tables including a previous version of the flash tables and a current version of the flash tables under the direction of the CPU, a non-volatile memory module including a magnetic random access memory (MRAM) configured to store changes to the flash tables, wherein the current version of the snapshot of the flash tables is used to reconstruct the flash tables upon power interruption, further wherein the flash tables are substantially periodically saved in the plurality of physically-addressed SSDs, and parts of the flash tables that are updated since a previous save are saved in the non-volatile memory module.

31. The computer system, as recited in claim 30, wherein the non-volatile memory module is configured to store a cache for caching the user data.

32. The computer system, as recited in claim 30, wherein the non-volatile memory module is configured to store a journal for logging changes before committing the changes.

33. The computer system, as recited in claim 30, wherein the PCIe controller is directly connected to the plurality of physically-addressed SSDs.

* * * * *